(12) United States Patent
Farrar et al.

(10) Patent No.: US 7,347,349 B2
(45) Date of Patent: Mar. 25, 2008

(54) APPARATUS AND METHOD FOR PRINTING MICRO METAL STRUCTURES

(75) Inventors: Paul A. Farrar, Bluffton, SC (US); Jerome M. Eldridge, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 445 days.

(21) Appl. No.: 10/602,322

(22) Filed: Jun. 24, 2003

(65) Prior Publication Data

US 2006/0032890 A1 Feb. 16, 2006

(51) Int. Cl.
*B23K 31/02* (2006.01)
(52) U.S. Cl. ...................................... 228/33
(58) Field of Classification Search .................. 228/33, 228/37, 32, 256, 257, 260, 261
See application file for complete search history.

(56) References Cited

U.S. PATENT DOCUMENTS

| | | | |
|---|---|---|---|
| 3,959,047 A | 5/1976 | Alberts et al. | 156/8 |
| 5,238,176 A * | 8/1993 | Nishimura | 228/256 |
| 5,364,011 A * | 11/1994 | Baker et al. | 228/180.21 |
| 5,457,345 A | 10/1995 | Cook et al. | 257/766 |
| 5,461,257 A | 10/1995 | Hundt | 257/707 |
| 5,642,261 A | 6/1997 | Bond et al. | 361/704 |
| 5,693,572 A | 12/1997 | Bond et al. | 437/209 |
| 6,136,689 A | 10/2000 | Farrar | 438/626 |
| 6,273,328 B1 * | 8/2001 | Maeda et al. | 228/254 |
| 6,386,436 B2 * | 5/2002 | Hembree | 228/254 |
| 6,435,396 B1 * | 8/2002 | Eldridge | 228/33 |
| 6,491,969 B2 * | 12/2002 | Eldridge | 427/554 |
| 6,708,868 B1 * | 3/2004 | Pilat | 228/180.22 |
| 6,844,253 B2 | 1/2005 | Farrar | |
| 7,028,879 B2 * | 4/2006 | Farrar et al. | 228/33 |
| 2001/0014524 A1 | 8/2001 | Farrar | 438/613 |
| 2002/0034581 A1 | 3/2002 | Farrar et al. | 427/58 |

OTHER PUBLICATIONS

Anonymous, "Combination Process for Final Metal Lines and Metal Terminals", Kenneth Mason Publications Ltd, Research Disclosure No. 342, England,(Oct. 1992), 1 page.
Anonymous, "Process for High Density of Chip Terminals on Large Wafers", Kenneth Mason Publications Ltd, Research Disclosure No. 02, England,(Feb.1993), 1 page.
Babiarz, A J., "Key Process Controls for Underfiling Flip Chips", *Solid State Technology*, 40(4), (Apr. 1997),77-8, 81, 83.
Jones, P , et al., "Bumped Wafers, Worth Their Weight in Gold?", *Advanced Packaging*, 8(1), (Jan. 1997),54-57.
Marcotte, V. C., "Review of Flip Chip Bonding", *Proceedings of the 2nd ASM International Electronic Materials and Processing Congress*, Apr. 24-28, 1989, Philadelphia, PA, 73-81.
Minges, Merrill , "Electronic Materials Handbook", Materials Park, OH : *ASM International*, (1989),301-440.
Puttlitz, Karl J., et al., "Solder Transfer Technique for Flip-Chip and Electronic Assembly Applications", *IEEE Transactions on Components, Packaging and Manufacturing Technology*, Part C, Vol. 21, No. 3, (Jul. 1998), 182-188.
Ryan, J. G., "Technology Challenges for Advanced Interconnects", *Advances in Metallization and Interconnect Systems for ULSI Applications*, Sep. 30-Oct. 2, 1997, San Diego CA, (1997), 1-5.
Hayes, Don, "Micron-Jet Printing of Polymers for Microelectronics Applications", *Proceedings for the 8th Meeting of the DuPont Symposium on Polyimides in Microelectronics*, (May 1998), 238-262

* cited by examiner

*Primary Examiner*—Jonathan Johnson
(74) *Attorney, Agent, or Firm*—Schwegman, Lundberg & Woessner, P.A.

(57) ABSTRACT

A method and device for printing liquid material such as liquid solder is provided. C4 structures as small as 10 microns in diameter can be produced using devices and methods described above. Further, devices and methods provided are able to operate at temperatures much higher than other print head designs such as piezoelectric actuated print heads. Additionally, due to the use of a gas flow restricting device and a recharging gas supply, ejection devices as described above can be used for a substantially extended lifetime, thus making devices and methods described above more economically desirable.

30 Claims, 7 Drawing Sheets

APPARATUS AND METHOD FOR PRINTING MICRO METAL STRUCTURES

TECHNICAL FIELD

This invention relates to printing small amounts of liquid material. Specifically this invention relates to a method and apparatus of forming chip interconnect devices in semiconductor fabrication.

BACKGROUND

With increasing numbers of transistors being formed on devices such as Ultra Large Scale Integration (ULSI) chips, additional demands are being placed upon the wiring and Input-Output (I.O.) processes. For example, the levels of interconnection metals required to wire the complex micro processors continues to increase. Because of the increased complexity, lower yield and cost associated with the metallurgy it would, in some cases be desirable to construct smaller chips, placing more of the wiring levels in the packaging. In order to accomplish this, without impacting performance, a large number of I.O. connections are required. One current I.O. structure design that is extensively used is the bumped chip or Controlled Collapse Chip Connect (C4) technology. As presently conceived it can provide up to a few thousand I.O.'s on a large chip, however, there is a need in the industry for higher I.O. densities.

The C4 pads size are currently limited by the ability to produce small holes in metal shadow masks that are employed to determine both pad and solder diameters. The masks must be or sufficient thickness to prevent warpage or damage during use or cleaning. This then limits the minimum hole size which can be economically produced. One current C4 process uses a layer of solder that is deposited after the formation of the pads and subsequently reflowed to form solder balls.

One approach to the need for higher density I.O. structures includes a solder transfer technique that selectively places individual solder bumps on a chip or wafer. Individual placement of solder allows for a smaller quantity of solder to be deposited, and allows a tighter position tolerance than shadow mask techniques. One individual placement method includes the use of a piezoelectric solder ball print-head. However, Curie temperatures of useful ceramics for piezoelectrics impose a practical limitation on the maximal operating temperatures of such print-heads. Because currently known ceramics for piezoelectrics cannot effectively operate at temperatures greater than about 300° C., solder material selection is limited and optimal jetting characteristics, such as solder viscosity and surface tension are compromised in piezoelectric print-head designs. Furthermore, piezoelectric printing devices are expensive to manufacture. Designs that incorporate large numbers of channels to apply large arrays of solder balls at high speed are cost prohibitive using piezoelectric designs.

What is needed is an individual placement method and apparatus that is capable of meeting increasingly demanding feature size and tolerance concerns. What is also needed is an individual placement method and apparatus that is capable of operating at high temperatures. What is also needed is an individual placement method and apparatus that is inexpensive to manufacture and operate.

SUMMARY

The above mentioned problems such as demanding feature size and tolerance concerns, operation at high temperatures, expense/efficiency, etc. are addressed by the present invention and will be understood by reading and studying the following specification.

An embodiment of a liquid material ejection device is shown. The liquid material ejection device includes a gas chamber, and a film located within the gas chamber. The film provides a gas that dissociates from the film when heated by a heating source. The liquid material ejection device also includes a conduit for ejecting liquid material. The conduit is in communication with the gas chamber. The liquid material ejection device also includes a recharging gas source coupled to the gas chamber, and a gas flow restricting device adapted to selectively provide gas from the recharging gas source to the gas chamber by actuation of the gas flow restricting device.

An embodiment of a liquid material ejection device is further shown. The liquid material ejection device includes a plurality of print heads, including a gas chamber, and a film located within the gas chamber. The film provides a gas that dissociates from the film when heated by a heating source. The liquid material ejection device also includes a conduit for ejecting liquid material in communication with the gas chamber. The liquid material ejection device also includes at least one recharging gas source coupled to at least one of the gas chambers. The liquid material ejection device also includes at least one gas flow restricting device adapted to selectively provide gas from the recharging gas source to at least one of the gas chambers by actuation of the gas flow restricting device. The liquid material ejection device also includes a print positioning system that locates at least one of the print heads relative to a substrate surface.

An embodiment of a method of ejecting a quantity of a liquid material is further shown. The method includes heating a film to release a quantity of gas. The film is located within a gas chamber. The method also includes pressurizing a conduit using pressure provided by the released quantity of gas and ejecting a quantity of the liquid material from within the conduit using the pressure provided by the quantity of gas. The method also includes introducing a recharging gas to the gas chamber wherein the quantity of gas is substantially restored in the film.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by devices, procedures, and combinations particularly pointed out in the appended claims.

DETAILED DESCRIPTION

Figure 1:
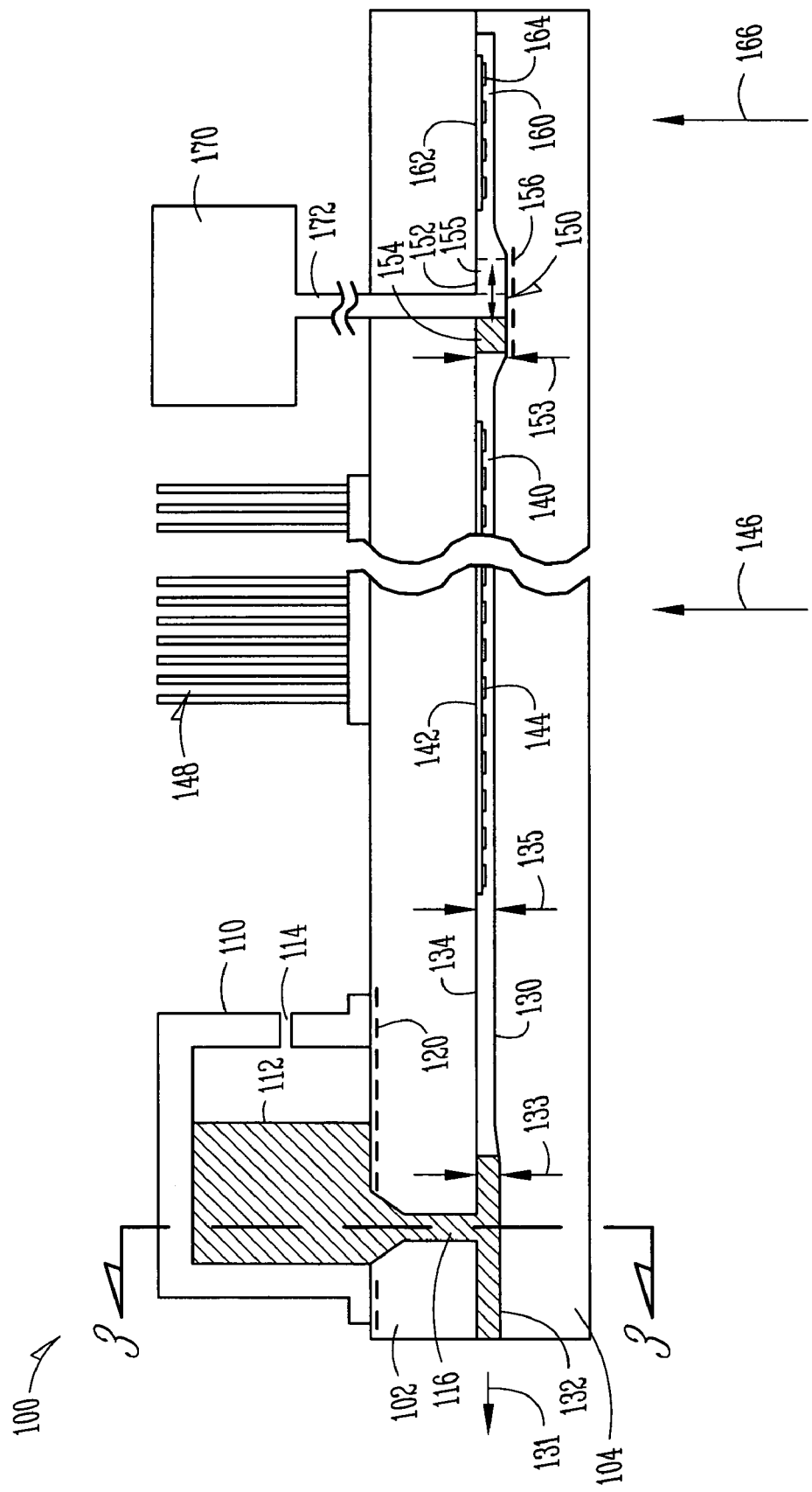
FIG. 1 illustrates a cross section view of a liquid material ejection device according to an embodiment of the invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

In the following description, terms such as top, side, bottom, etc. are used for illustration to refer to locations within the drawings when oriented in a normal reading position. In operation, embodiments of the devices shown may be oriented differently depending on specific applications.

Embodiments as disclosed herein include devices and methods by which individual and or large arrays or micro solder drops as well as other shapes of the material deposited can be accurately placed on a chip wafer or other surface. Embodiments shown have the advantage of being able to process higher melting solders which are desirable for future technologies. In addition, embodiments shown, teach the design and construction of miniaturized gas flow devices which can be used to reform gas containing compound structures in situ and thus increase the useful lifetime of printing heads as disclosed.

Liquid material ejection devices and methods as shown herein are similar to devices and methods described in U.S. Pat. No. 6,435,396 which is herein incorporated by reference. The following descriptions of selected embodiments is described almost entirely in terms of its potential application for ejecting solder balls onto IC contact pads for packaging purposes. However it will be clear to those skilled in the art that it can be used in a wide variety of other applications involving gas and liquid flow. The following detailed description is, therefore, not to be taken in a limiting sense, and the scope of the present invention is defined only by the appended claims, along with the full scope of equivalents to which such claims are entitled.

FIG. 1 shows a liquid material ejection device 100. In one embodiment the liquid material ejection device 100 is adapted to eject liquid solder 112. Other liquid materials are also contemplated within the scope of the invention, including, but not limited to, other liquid metals. The liquid material ejection device 100 includes a reservoir 110 with a heating device 120 located adjacent to the reservoir 110. A heating device 120 is used in embodiments where the liquid material (such as solder) is not liquid in room temperature state, and must be heated to enable flow of the material. In one embodiment, the heating device 120 includes a resistive heating element, such as a serpentine structure. Other heating devices are also acceptable. Although the heating device 120 is shown beneath the reservoir 110 in FIG. 1, other locations are contemplated where the heating device 120 is in a location sufficient to alter a viscosity of the solder 112. In one embodiment, a port 114 is included in the reservoir 110 to allow the reservoir 110 to equalize pressure differences.

The liquid material ejection device 100 includes a conduit 130. In one embodiment, the conduit is formed by a first base portion 102 and a second base portion 104. In one embodiment, the first base portion 102 includes a semiconductor material. In one embodiment, the second base portion 104 includes an optically transparent material such as glass. The conduit 130 further includes a priming portion 132, and a gas portion 134. In FIG. 1, a passage 116 is shown coupling the reservoir 110 to the conduit 130 in a region of the priming portion 132. In one embodiment, the priming portion 132 and the gas portion are distinguishable from one another by differing geometry. In FIG. 1, the priming portion 132 includes a first diameter 133.

FIG. 1 also shows the gas portion 134 that includes a second diameter 135. In one embodiment, the first diameter 133 is larger than the second diameter 135. In one embodiment, physical/chemical interactions such as surface tension of the priming portion 132 and the gas portion 134 with the solder 112 dictate that the solder 112 only wets the priming portion 132 and not the gas portion 134. In one embodiment, the differing diameters 133 and 135 contribute to the solder 112 only wetting the priming portion.

In one embodiment, material choices and/or coatings in the priming portion 132 and the gas portion 134 contribute to a preferential wetting of the priming portion. In one embodiment, a non-oxidizable material such as platinum, rhodium, palladium, gold, etc. coats the interior of the priming portion 132. In one embodiment a non-wetting material coats the interior of the gas portion 134. Examples of non-wetting materials include, but are not limited to, clean oxides such as silicon dioxide, aluminum oxide, etc. Other examples of non-wetting materials include, but are not limited to, polymer materials such as polytetraflouroethlyene (PTFE). Differing materials in the priming portion 132 and in the gas portion 134 create different interfacial energy with the solder 112 to encourage wetting of the solder only in particular regions such as the priming portion 132. In one embodiment, both geometry such as diameter, and coating material choice encourage selective wetting of the solder 112 only in the priming portion 132.

The liquid material ejection device 100 also includes a gas chamber 140. The gas chamber is coupled to the conduit 130 at an end of the gas portion 134. Inside the gas chamber 140 is a coating of a thermally insulating material 142. On top of the thermally insulating material 142, a number of islands 144 are formed. In one embodiment, the islands 144 are formed from a compound material. Upon heating, the compound material of the islands 144 dissociates, and a gas is released. In one embodiment, the number of islands 144 are formed from titanium hydride ($TiH_2$). Other compound materials that release a gas upon heating are also acceptable.

In operation of one embodiment, the islands 144 are heated using a laser beam 146 from a laser source (not shown). The laser beam 146 enters through the optically transparent second base portion 104 and transmits energy to an individual island 144. In embodiments using a laser source, the thermally insulating material 142 helps to concentrate the energy of the laser beam 146 in the single selected island 144. Upon rapid heating, the selected island 144 releases a known quantity of gas in relation to the volume of the island. The gas then pressurizes the gas chamber 140, in turn pressurizing the conduit 130 which ejects a quantity of solder 112 located in the priming portion 132 along direction 131. In one embodiment, to avoid unwanted heating of non-selected islands 144, a heat dissipation device 148 such as a number of cooling fins is included.

The liquid material ejection device 100 includes a gas flow restricting device 150. In one embodiment, the gas flow restricting device, in combination with a recharging gas source, allows spent islands 144 to be recharged after use. This provides a substantial increase in usable lifetime of the ejection device 100. Details of one embodiment of a gas flow restricting device 150 are discussed below.

In FIG. 1, the gas flow restricting device 150 includes a valve with at least a portion of the gas flow restricting device 150 operating through physical motion. FIG. 1 shows a valve chamber 152 with a diameter 153. In one embodiment, the diameter 153 is larger than a diameter 135 of the gas portion 134 of the conduit 130. Similar to description of the priming portion 132 and the gas portion 134, in one embodiment, the geometry of the valve chamber 152 is designed for wetting of the valve chamber 152 by a solder material. In one embodiment, the valve chamber 152 is coated with a non-oxidizable material to enhance wetting characteristics as described above. A gas blocking mass 154 is shown within the valve chamber 152. In one embodiment, the gas blocking mass includes a solder mass. A heating device 156 is shown located adjacent to the valve chamber 152. In one embodiment, the heating device 156 includes a resistive heating element such as a passivated thin film resistor.

The gas flow restricting device 150 operates is connection with a second gas chamber 160. In one embodiment, the second gas chamber 160 includes a coating of a thermally insulating material 162. On top of the thermally insulating material 162, a number of islands 164 are formed. In one embodiment, the islands 164 are formed from a compound material. Upon heating, the compound material of the islands 164 dissociates, and a gas is released. In one embodiment, the number of islands 164 are formed from titanium hydride (TiH$_2$). Other compound materials that release a gas upon heating are also acceptable. In one embodiment, the number of islands 164 are heated using a laser beam 166 similar to elements described above.

In one method of operation of a gas flow restricting device 150, the heating device 120 is cooled to solidify or raise the viscosity of the solder 112 in the priming portion 132 of the conduit 130. The heating device 156 is then heated to liquefy or lower the viscosity of the gas blocking mass 154. One of the remaining islands 144 is then heated to release a charge of gas that moves the loosened gas blocking mass 154 from a first position to a second position 155 (shown in ghost lines in FIG. 1). The heating device 156 is then cooled to re-solidify or raise the viscosity of the gas blocking mass 154 to hold it in the second position.

A recharging gas supply 170 is coupled to the gas chamber 140 through the gas flow restricting device 150 as shown. In embodiments using titanium hydride (TiH$_2$) islands 144, the recharging gas supply 170 includes hydrogen gas. In one embodiment, the recharging gas supply 170 is located external to the ejection device 100 and is coupled to the gas flow restricting device 150 by a conduit 172. Once the gas blocking mass 154 is located in the second position 155, the recharging gas is free to flow into the gas chamber 140 and combine with the spent material in the islands 144.

After a time sufficient to recharge the islands 144, the gas flow restricting device 150 is actuated once more to isolate the gas chamber 140. In one method, the heating device 156 is again heated to liquefy or lower the viscosity of the gas blocking mass 154. The second gas chamber 160 as described above is utilized to move the loosened gas blocking mass 154 from the second position 155 back to the first position where it blocks gas from within the gas chamber 140. The heating device 156 is then cooled to re-solidify or raise the viscosity of the gas blocking mass 154 to hold it in the first position. The heating device 120 is then heated to liquefy or lower the viscosity of the solder 112 in the priming portion 132, thus readying the ejection device 100 for operation with newly recharged islands 144. Recharging operations through use of the gas flow restricting device 150 can be performed a number of times, thus significantly extending the useful lifetime of ejection device 100.

Figure 2:
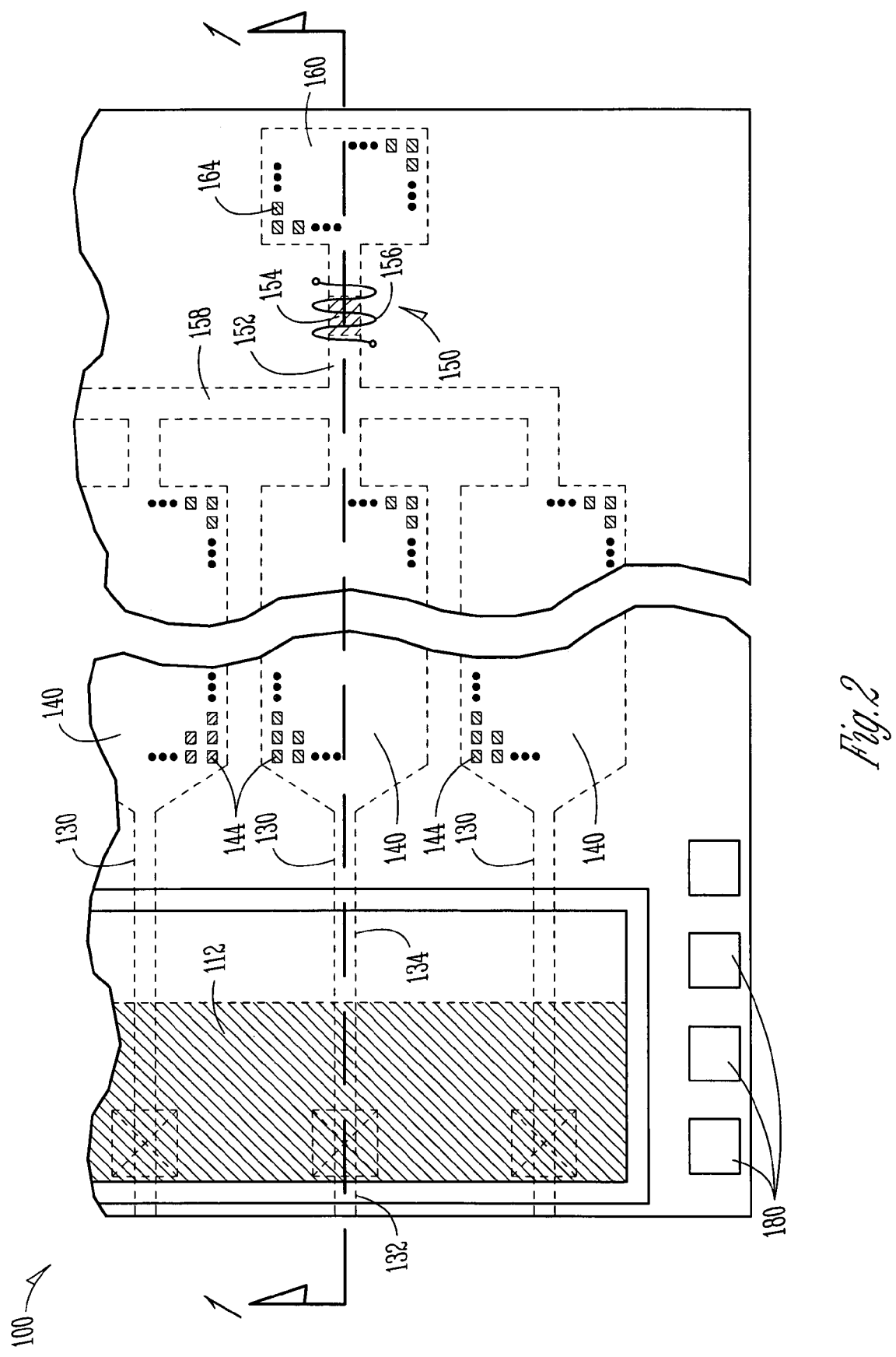
FIG. 2 illustrates a top view with respect to FIG. 1 of a liquid material ejection device according to an embodiment of the invention.

FIG. 2 shows the liquid material ejection device 100 from a top view. In one embodiment, as illustrated in FIG. 2, a plurality of gas chambers 140 and conduits 130 are combined in a single liquid material ejection device 100. In one embodiment, a single print head is described as including a gas chamber coupled to a conduit with a port for ejecting liquid material. The use of a plurality of print heads permits the ejection device 100 to operate through a larger number of cycles before recharging spent islands 144. Additionally, the use of a plurality of print heads permits embodiments where a plurality of materials are deposited using the same ejection device 100. For example, in one embodiment, a high temperature solder is applied by a first print head, and a low temperature solder is applied by a second print head. In one embodiment, a solder is applied by a first print head, and a liquid flux is applied by a second print head.

The valve chamber 152 is also shown in FIG. 2 with the gas blocking mass 154. In one embodiment, as shown in FIG. 2, a single gas flow restricting device 150 is used to selectively recharge a number of islands 144 in a number of gas chambers 140. Linking conduits 158 are shown coupling the recharging gas from the gas flow restricting device 150 to multiple gas chambers 140. In other embodiments, multiple recharging gas sources are coupled to multiple gas chambers 140. In one embodiment, there is a gas flow restricting device 150 for each gas chamber 140.

FIG. 2 further shows a number of electrical contacts 180. In one embodiment, the number of contacts 180 connect current with devices such as the heating device 120 and the heating device 156.

Figure 3:
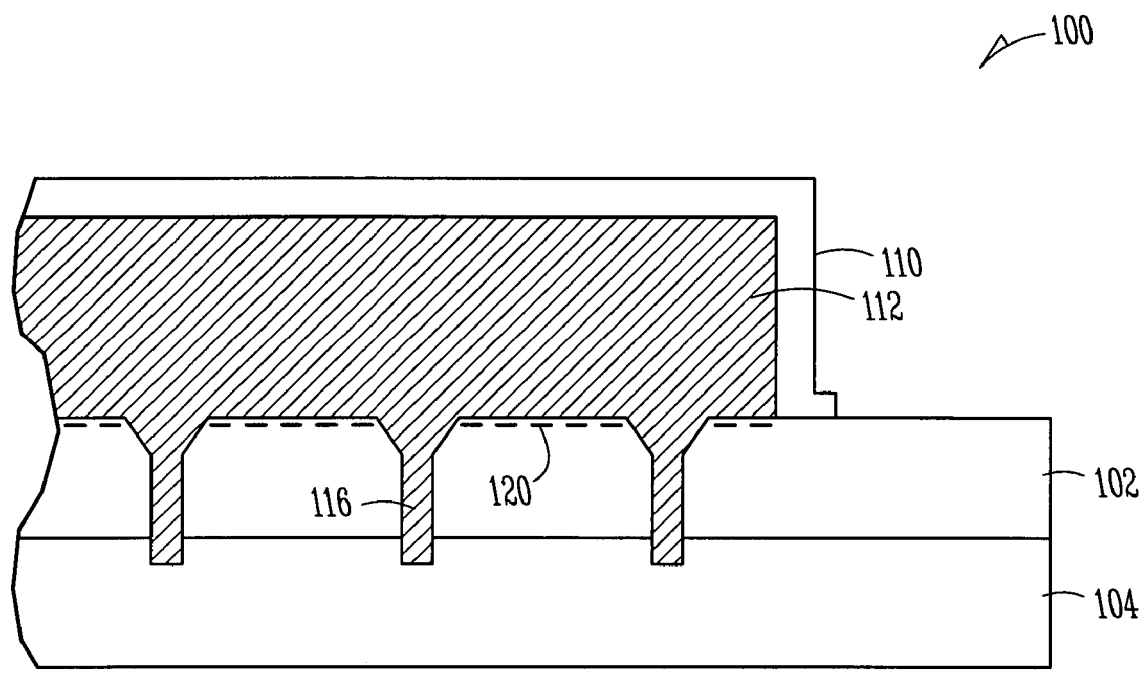
FIG. 3 illustrates a cross section view of a liquid material ejection device according to an embodiment of the invention.

FIG. 3 shows a cross section view of the common reservoir 110 with solder 112 flowing through passages 116 in multiple print heads. As discussed above, in other embodiments, each print head includes an individual reservoir 110.

In one embodiment, the liquid material ejection device 100 includes a print positioning system coupled to at least one gas chamber 140 and conduit 130. In one embodiment, the print positioning system includes an X-Y stage. Suitable devices for translating along the X-Y stage include, but are not limited to, stepper motors. Other print positioning systems include three axis positioning systems, polar coordinate positioning systems, etc.

Figure 4:
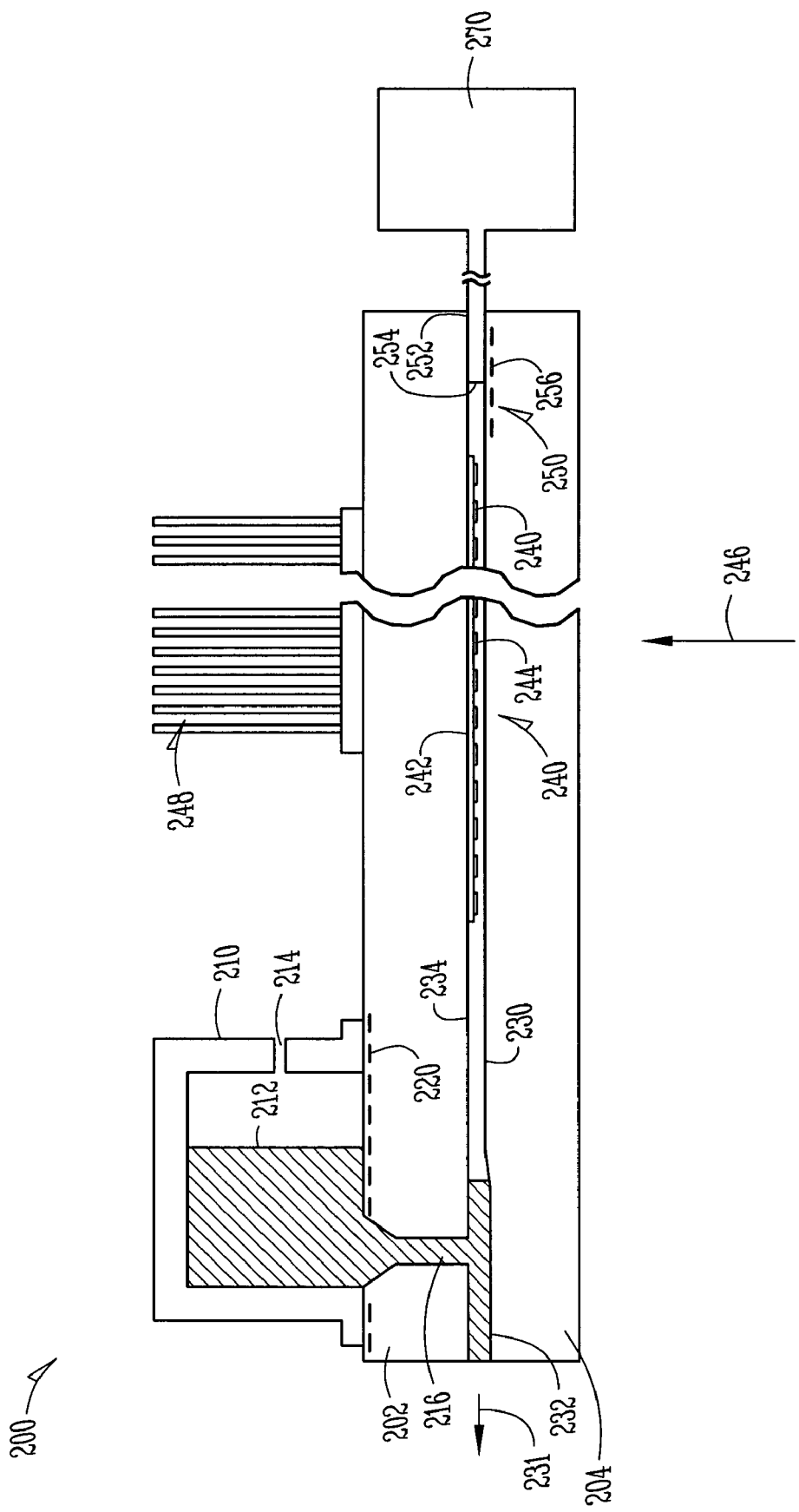
FIG. 4 illustrates a cross section view of another liquid material ejection device according to an embodiment of the invention.

FIG. 4 shows a liquid material ejection device 200. In one embodiment the liquid material ejection device 200 is adapted to eject liquid solder 212. Other liquid materials are also contemplated within the scope of the invention, including, but not limited to, other liquid metals. The liquid material ejection device 200 includes a reservoir 210 with a heating device 220 located adjacent to the reservoir 210. In one embodiment, a port 214 is included in the reservoir 210 to allow the reservoir 210 to equalize pressure differences.

The liquid material ejection device 200 includes a conduit 230. In one embodiment, the conduit is formed by a first base portion 202 and a second base portion 204. In one embodiment, the first base portion 202 includes a semiconductor material. In one embodiment, the second base portion 204 includes an optically transparent material such as glass. The conduit 230 further includes a priming portion 232, and a gas portion 234. In FIG. 4, a passage 216 is shown coupling the reservoir 210 to the conduit 230 in a region of the priming portion 232. In one embodiment, the priming portion 232 and the gas portion are distinguishable from one another by geometry and/or materials and coatings as described in embodiments above.

The liquid material ejection device 200 also includes a gas chamber 240. The gas chamber is coupled to the conduit 230 at an end of the gas portion 234. Inside the gas chamber 240 a coating of a thermally insulating material 242. On top of the thermally insulating material 242, a number of islands 244 are formed. In one embodiment, the islands 244 are formed from a compound material. Upon heating, the compound material of the islands 244 dissociates, and a gas is released. In one embodiment, the number of islands 244 are formed from titanium hydride ($TiH_2$). Other compound materials that release a gas upon heating are also acceptable.

In operation of one embodiment, the islands 244 are heated using a laser beam 246. The laser beam 246 enters through the optically transparent second base portion 204 and transmits energy to an individual island 244. In embodiments using a laser source, the thermally insulating material 242 helps to concentrate the energy of the laser beam 246 in the single selected island 244. Upon rapid heating, the selected island 244 releases a known quantity of gas in relation to the volume of the island. The gas then pressurizes the gas chamber 240, in turn pressurizing the conduit 230 which ejects a quantity of solder 212 located in the priming portion 232 along direction 231. In one embodiment, to avoid unwanted heating of non-selected islands 244, a heat dissipation device 248 such as a number of cooling fins is included.

The liquid material ejection device 200 includes a gas flow restricting device 250. In one embodiment, the gas flow restricting device 250, in combination with a recharging gas source, allows spent islands 244 to be recharged after use. This provides a substantial increase in usable lifetime of the ejection device 200. Details of one embodiment of a gas flow restricting device 250 are discussed below.

In FIG. 4, the gas flow restricting device 250 includes a selectively permeable membrane 254 located within a recharging conduit 252. In one embodiment, the permeability of the membrane 254 is selected by varying the temperature of the membrane 254. Other variables are also possible to selectively vary gas flow through the membrane, such as varying gas pressure on either side of the membrane.

In an embodiment shown in FIG. 4, a heating device 256 is shown located adjacent to the membrane 254. In one embodiment, by heating the membrane 254 with the heating device 256, the permeability of the membrane 254 is increased, allowing sufficient gas flow from a gas source 270 to recharge the islands 244 similar to other embodiments disclosed herein. Likewise, cooling the membrane 254 by reducing heat of the heating device 256 reduces the permeability of the membrane 254, effectively shutting off the gas flow restricting device 250 after recharging is complete.

In one embodiment, the membrane 254 material is chosen to be selectively permeable with respect to a hydrogen recharging gas source, as used in conjunction with titanium hydride (TiH2) islands 244. In one embodiment, the membrane is as thick as several thousandths of an inch, and sufficiently permeable at temperatures under 1000 degrees Centigrade. In one embodiment, the membrane 254 includes a palladium (Pd) membrane.

Figure 5:
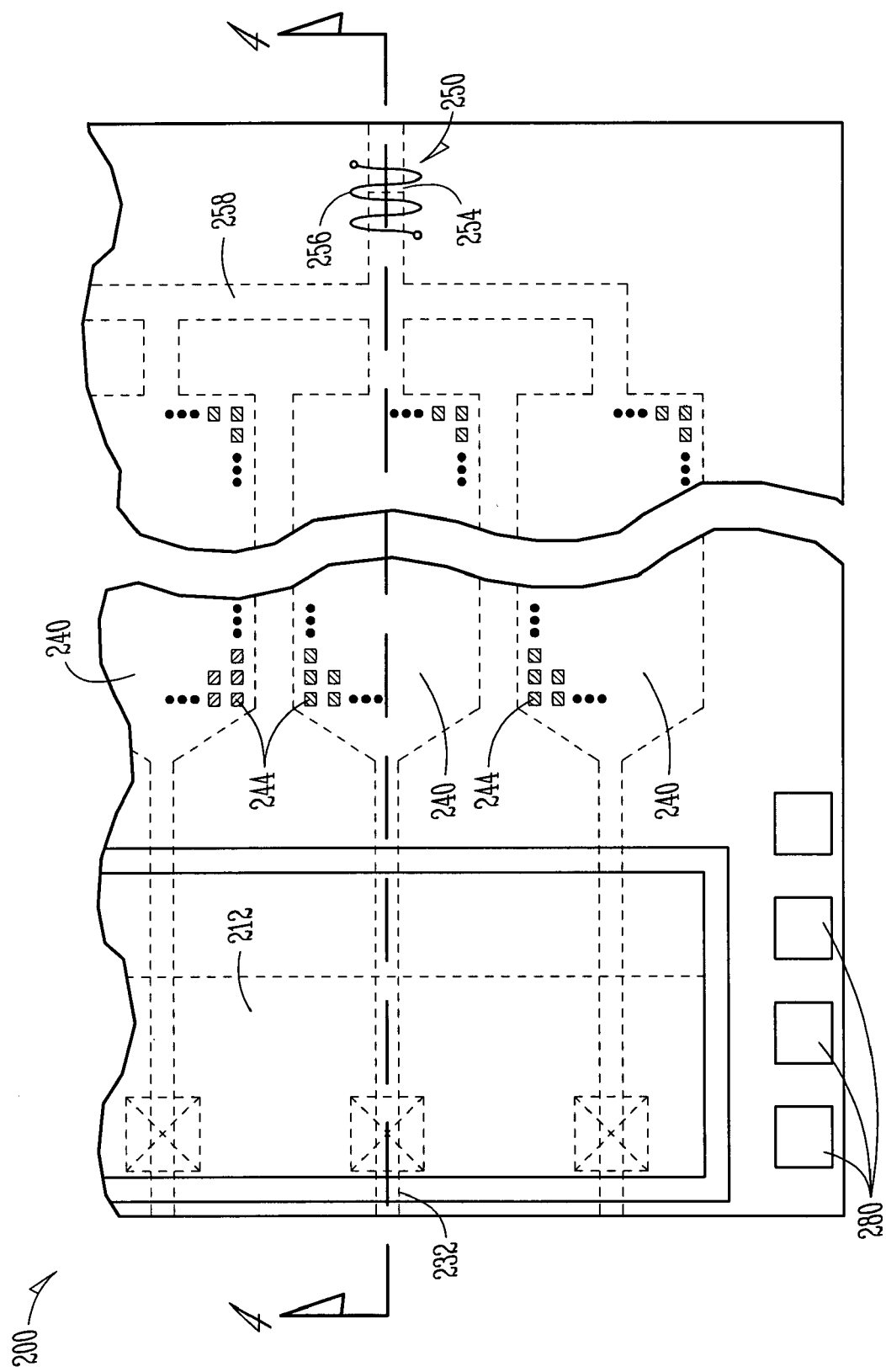
FIG. 5 illustrates a top view with respect to FIG. 4 of a liquid material ejection device according to an embodiment of the invention.

The gas flow restricting device 250 is also shown in FIG. 5 with the membrane 254. In one embodiment, as shown in FIG. 5, a single gas flow restricting device 250 is used to selectively recharge a number of islands 244 in a number of gas chambers 240. Linking conduits 258 are shown coupling the recharging gas from the gas flow restricting device 250 to multiple gas chambers 240. In other embodiments, multiple recharging gas sources are coupled to multiple gas chambers 240. In one embodiment, there is a gas flow restricting device 250 for each gas chamber 240. FIG. 5 further shows a number of electrical contacts 280. In one embodiment, the number of contacts 280 connect current with devices such as the heating device 220 and the heating device 256.

Figure 6:
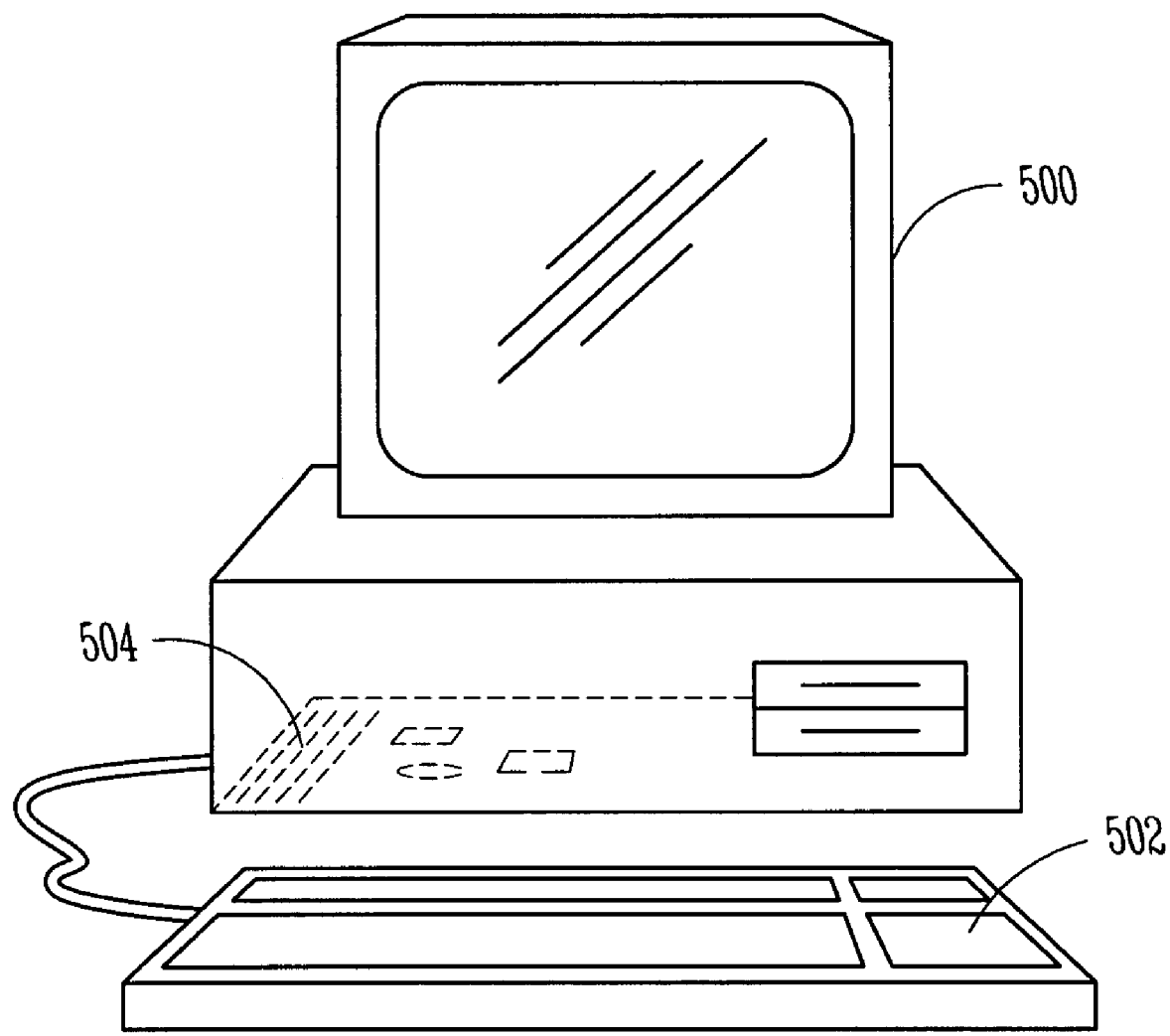
FIG. 6 shows an information handling system according to an embodiment of the invention.
Figure 7:
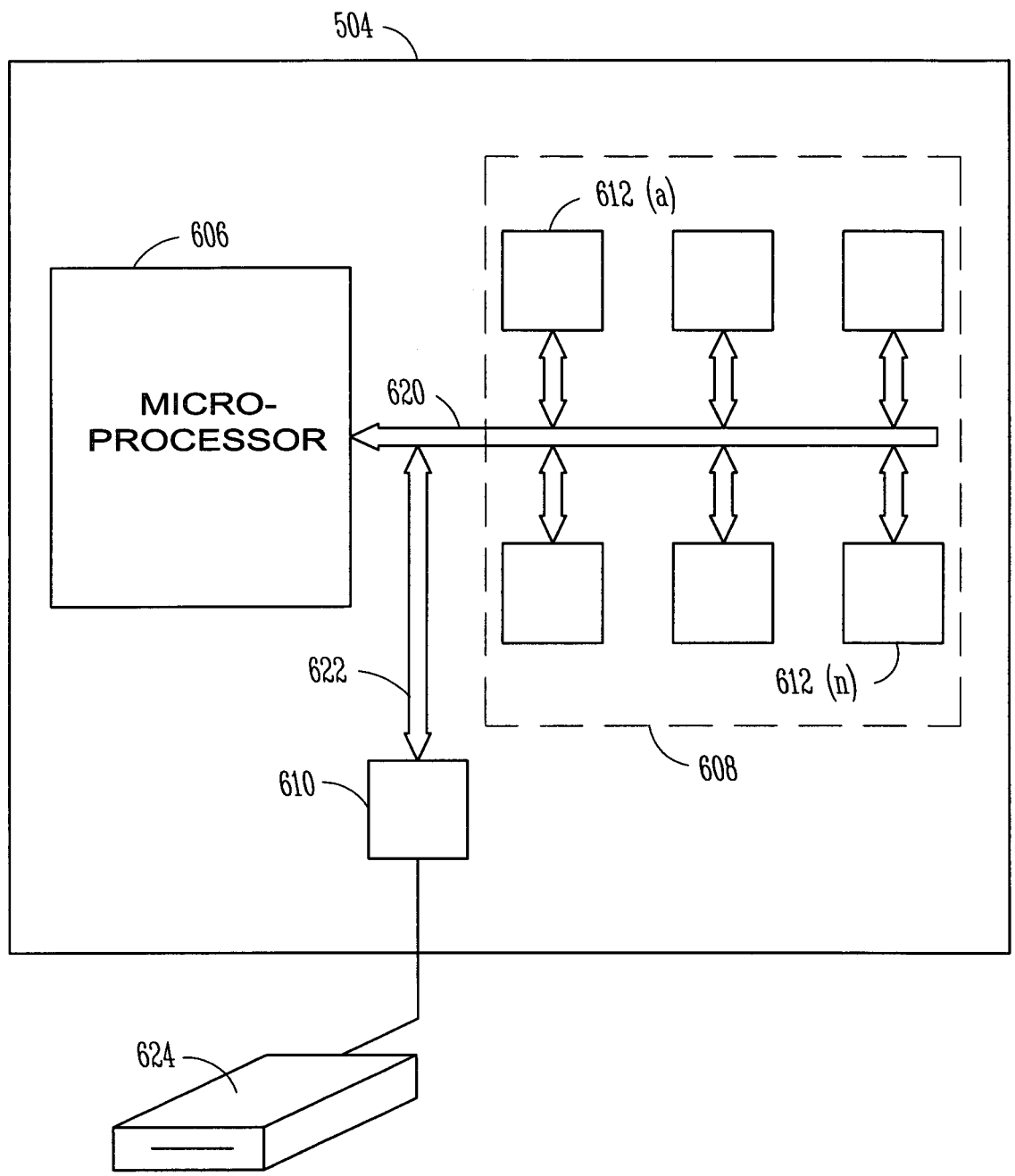
FIG. 7 shows a block diagram of a processing unit according to an embodiment of the invention.

Although liquid solder is used above as an example, the ejection devices as described above can be used to eject any of a number of liquid materials. In one embodiment, ejection devices as described above are used to form C4 structures for integrated circuits. Semiconducting wafers, semiconductor devices, and IC's utilizing structures formed by the methods described above may be implemented into memory devices and information handling devices as shown in FIGS. 6 and 7, and as described below. While specific types of memory devices and computing devices are shown, it will be recognized by one skilled in the art that several types of memory devices and information handling devices could include embodiments of the invention.

A personal computer, as shown in FIGS. 6 and 7, includes a monitor 500, keyboard input 502 and a central processing unit 504. The processor unit typically includes microprocessor 606, memory bus circuit 608 having a plurality of memory slots 612($a$–$n$), and other peripheral circuitry 610. Peripheral circuitry 610 permits various peripheral devices 624 to interface processor-memory bus 620 over input/output (I/O) bus 622. The personal computer shown in FIGS. 6 and 7 also includes at least one solder structure such as a C4 pad according to embodiments described above.

Microprocessor 606 produces control and address signals to control the exchange of data between memory bus circuit 608 and microprocessor 606 and between memory bus circuit 608 and peripheral circuitry 610. This exchange of data is accomplished over high speed memory bus 620 and over high speed I/O bus 622.

Coupled to memory bus 620 are a plurality of memory slots 612($a$–$n$) which receive memory devices. For example, single in-line memory modules (SIMMs) and dual in-line memory modules (DIMMs) may be used in the implementation of embodiments of the present invention. Those skilled in the art will recognize that a wide variety of memory devices may be coupled to the plurality of memory slots 612($a$–$n$). Acceptable memory devices include, but are not limited to, SDRAMs, SLDRAMs, RDRAMs and other DRAMs and SRAMs, VRAMs and EEPROMs, may be used in the implementation of the present invention. In one embodiment, a memory device coupled to at least one of the plurality of memory slots 612($a$–$n$) includes at least one solder structure such as a C4 pad according to embodiments described above.

CONCLUSION

Using devices and methods as described above, it is possible to individually place small structures of solder. The bursts of gas released by heated islands can be adjusted to very small and precise bursts by varying the size of the individual islands. As one example, C4 structures as small as 10 microns in diameter can be produced using devices and methods described above. In contrast, previous technology was only able to produce C4 structures with diameters in the range of 100 microns. The ability to use precise location devices such as X-Y stages also provides improvements in feature location tolerances over prior mask lithography methods.

Further, devices as described above are able to operate at temperatures much higher than other print head designs such as piezoelectric actuated print heads. Additionally, due to the use of a gas flow restricting device and a recharging gas supply, ejection devices as described above can be used for a substantially extended lifetime, thus making devices and methods described above more economically desirable.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

The invention claimed is:

1. A liquid material ejection device, comprising:
   a gas chamber;
   a film located within the gas chamber, the film capable of providing a gas that dissociates from the film when heated by a heating source;
   a conduit for ejecting liquid material in communication with the gas chamber;
   a recharging gas source coupled to the gas chamber; and
   a gas flow restricting device adapted to selectively provide gas from the recharging gas source to the gas chamber by actuation of the gas flow restricting device.

2. The liquid material ejection device of claim 1, wherein the liquid material includes liquid solder.

3. The liquid material ejection device of claim 1, wherein the gas includes hydrogen gas.

4. The liquid material ejection device of claim 1, wherein the film includes titanium hydride ($TiH_2$).

5. The liquid material ejection device of claim 1, wherein the heating source includes a laser heating source.

6. The liquid material ejection device of claim 1, wherein the gas flow restricting device includes a valve.

7. The liquid material ejection device of claim 6, wherein the valve includes a gas blocking mass wherein a location of the gas blocking mass is moveable from a first position to a second position using a method, including:
   melting at least a portion of the gas blocking mass in the first position;
   moving the gas blocking mass; and
   solidifying the portion of the gas blocking mass in the second position.

8. The liquid material ejection device of claim 1, wherein the gas flow restricting device includes a membrane wherein gas permeability of the membrane is selectively controlled.

9. The liquid material ejection device of claim 8, wherein the gas permeability of the membrane is selectively controlled by varying a temperature of the membrane.

10. The liquid material ejection device of claim 9, wherein the membrane includes palladium (Pd).

11. A liquid material ejection device, comprising:
    a gas chamber;
    a film located within the gas chamber, the film capable of providing a gas that dissociates from the film when heated by a heating source;
    a conduit for ejecting liquid material in communication with the gas chamber;
    a recharging gas source coupled to the gas chamber; and
    a valve adapted to selectively provide gas from the recharging gas source to the gas chamber by selective positioning of a gas blocking mass.

12. The liquid material ejection device of claim 11, wherein the valve includes a gas blocking mass wherein a location of the gas blocking mass is moveable from a first position to a second position using a method, including:
    melting at least a portion of the gas blocking mass in the first position;
    moving the gas blocking mass; and
    solidifying the portion of the gas blocking mass in the second position.

13. The liquid material ejection device of claim 12, wherein the gas blocking mass includes a solder mass.

14. The liquid material ejection device of claim 11, wherein the liquid material includes liquid solder.

15. The liquid material ejection device of claim 11, wherein the gas includes hydrogen gas.

16. The liquid material ejection device of claim 11, wherein the film includes titanium hydride ($TiH_2$).

17. A liquid material ejection device, comprising:
    a gas chamber;
    a film located within the gas chamber, the film capable of providing a gas that dissociates from the film when heated by a heating source;
    a conduit for ejecting liquid material in communication with the gas chamber;
    a recharging gas source coupled to the gas chamber; and
    a membrane adapted to selectively provide gas from the recharging gas source to the gas chamber by selectively altering a permeability of the membrane.

18. The liquid material ejection device of claim 17, wherein the gas includes hydrogen gas.

19. The liquid material ejection device of claim 17, wherein the film includes titanium hydride ($TiH_2$).

20. The liquid material ejection device of claim 17, wherein the permeability of the membrane is selectively controlled by varying a temperature of the membrane.

21. The liquid material ejection device of claim 17, wherein the membrane includes palladium (Pd).

22. A liquid material ejection device, comprising:
    a plurality of print heads, including:
       a gas chamber;
       a film located within the gas chamber, the film capable of providing a gas that dissociates from the film when heated by a heating source;
       a conduit for ejecting liquid material in communication with the gas chamber;
    at least one recharging gas source coupled to at least one of the gas chambers;

at least one gas flow restricting device adapted to selectively provide gas from the recharging gas source to at least one of the gas chambers by actuation of the gas flow restricting device; and a print positioning system capable of locating at least one of the print heads relative to a substrate surface.

23. The liquid material ejection device of claim 22, wherein the print positioning system includes an X-Y translation stage.

24. The liquid material ejection device of claim 22, wherein a single recharging gas source is provided for multiple gas chambers.

25. The liquid material ejection device of claim 22, wherein a single gas flow restricting device is provided for multiple gas chambers.

26. The liquid material ejection device of claim 22, wherein a first one of the plurality of print heads contains solder, and a second one of the plurality of print heads contains flux.

27. A liquid material ejection device, comprising:

a gas chamber;

a means for storing gas located within the gas chamber, wherein the gas dissociates from the means when heated by a heating source;

a conduit for ejecting liquid material in communication with the gas chamber;

a recharging gas source coupled to the gas chamber; and a selective gas access means for selective introduction of the gas from the recharging gas source to the gas chamber.

28. The liquid material ejection device of claim 27, wherein the means for storing gas includes a titanium hydride ($TiH_2$) film.

29. The liquid material ejection device of claim 27, wherein the selective gas access means includes a valve.

30. The liquid material ejection device of claim 27, wherein the selective gas access means includes a selectively permeable membrane.

* * * * *